(12) United States Patent
Cassia et al.

(10) Patent No.: US 7,851,947 B2
(45) Date of Patent: Dec. 14, 2010

(54) METHODS AND APPARATUSES FOR SELECTABLE VOLTAGE SUPPLY

(75) Inventors: Marco Cassia, San Diego, CA (US); Aristotele Hadjichristos, Cary, NC (US); Conor Donovan, San Francisco, CA (US); Sang-Oh Lee, Cupertino, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 0 days.

(21) Appl. No.: 11/935,186

(22) Filed: Nov. 5, 2007

(65) Prior Publication Data

US 2009/0115253 A1    May 7, 2009

(51) Int. Cl.
   *H02B 1/24*    (2006.01)
(52) U.S. Cl. ...................................... 307/113
(58) Field of Classification Search ................. 307/113, 307/112
   See application file for complete search history.

(56) References Cited

U.S. PATENT DOCUMENTS 6,590,440 B1 * 7/2003 Williams et al. ............. 327/396
6,847,249 B1 * 1/2005 Brokaw ....................... 327/408
2008/0084195 A1 * 4/2008 Frew et al. .................. 323/282

FOREIGN PATENT DOCUMENTS

EP         0442688     8/1991
WO     2008039622     4/2008

OTHER PUBLICATIONS

International Search Report-PCT/US2008/082504, International Search Authority-European Patent Office-May 8, 2009.
Written Opinion-PCT/US08/082504, International Search Authority-European Patent Office-May 8, 2009.

* cited by examiner

*Primary Examiner*—Robert L. DeBeradinis
(74) *Attorney, Agent, or Firm*—William M. Hooks (57) ABSTRACT

A circuit which selects a supply voltage from a plurality of voltage supplies is presented. The circuit includes a first transistor configured to select a first voltage supply, a second transistor configured to select a second voltage supply, a first parasitic current inhibitor coupled the first transistor, the first voltage supply, and the second voltage supply, where the first parasitic current inhibitor automatically utilizes the voltage supply providing the highest voltage for preventing a substrate current from flowing through a bulk node of the first transistor, and a second parasitic current inhibitor coupled the second transistor, the first voltage supply, and the second voltage supply, where the second parasitic current inhibitor automatically utilizes the voltage supply providing the highest voltage for preventing a substrate current from flowing through a bulk node of the second transistor.

24 Claims, 6 Drawing Sheets

METHODS AND APPARATUSES FOR SELECTABLE VOLTAGE SUPPLY

FIELD OF DISCLOSURE

The embodiments of the disclosure relate generally to voltage supply circuits, and more specifically, to integrated circuit voltage supplies which can select a voltage supply having a desired value from a plurality of different voltage supplies.

BACKGROUND

As integrated circuit fabrication techniques continue to decrease into deep-submicron processes, the supply voltages for powering devices made by these techniques continues to decrease. Moreover, in order to extend battery life for portable devices (such as, for example, mobile terminals) there is a strong motivation for lowering power consumption.

To this end, there can be motivating reasons for having a plurality of voltage supplies on a chip, each of which may be selected through one or more selection signals. For example, it may be useful to have a selectable voltage supply in order to meet or exceed a circuit's performance specifications. Also, it might be useful to select between two or more supplies for a specific circuit, choosing a supply according to the operation mode, or perhaps to reduce power consumption. Such an approach can involve a programmable on-chip switch to select a desired voltage. For proper operation, the switch should be able to handle the different voltages and different turn-on/turn-off times of the different supplies. If the timing is not properly taken into account, large substrate currents could flow and result in the latch-up of a device.

A conventional selectable voltage supply may use switches implemented with large PMOS transistors. If the voltage differences between the supplies are large, the parasitic diodes of the PMOS transistors can conduct. This can lead to large parasitic currents which can cause a variety of breakdown phenomena of the transistor devices.

Accordingly, there is a need for a voltage supply selector which can select a particular voltage supply while eliminating leakage currents to ensure proper functioning of the integrated circuit device.

SUMMARY

Methods and apparatuses for selectable voltage supplies which eliminate or at least mitigate and/or reduce parasitic currents are presented.

In one embodiment, a circuit which selects a supply voltage from a plurality of voltage supplies is presented. The circuit includes a first transistor configured to select a first voltage supply, and a second transistor configured to select a second voltage supply. The circuit further includes a first parasitic current inhibitor coupled to the first transistor, the first voltage supply, and the second voltage supply, where the first parasitic current inhibitor automatically utilizes the voltage supply providing the highest voltage for preventing a substrate current from flowing through a bulk node of the first transistor. The circuit further includes a second parasitic current inhibitor coupled to the second transistor, the first voltage supply, and the second voltage supply, where the second parasitic current inhibitor automatically utilizes the voltage supply providing the highest voltage for preventing a substrate current from flowing through a bulk node of the second transistor.

In another embodiment, a circuit for mitigating parasitic currents in a selectable voltage supply is presented. The circuit includes a first n-channel transistor having a drain node and a gate node connected to a first voltage supply, where the first n-channel transistor couples a bulk node and a source node of a first supply switching transistor when the first voltage supply is active, and a second n-channel transistor having a drain node and a gate node connected to a second voltage supply. The circuit further includes a source node connected to the source node of the first n-channel transistor, wherein the second n-channel transistor applies a reverse bias voltage to the first supply switching transistor when the first voltage supply is inactive. The circuit may further include a first p-channel transistor having a gate node connected to the first voltage supply, a source node connected to the second voltage supply, where the first p-channel transistor couples a bulk node and a source node of a second supply switching transistor when the first voltage supply is inactive. The circuit may further include and a third n-channel transistor having a drain node and gate node connected to the first voltage supply, and a source node connected to the drain node of the first p-channel transistor, wherein the third n-channel transistor applies the reverse bias voltage to the second supply switching transistor is active.

In yet another embodiment, a method for mitigating parasitic currents in a circuit having a plurality of voltage supplies is presented. The method includes receiving a first voltage select signal having an ON and OFF state, where the ON state corresponds to a first voltage supply being active. The method further includes receiving a second voltage select signal having an ON and OFF state, where the ON state corresponds to a second voltage supply being active. The method further includes determining automatically the highest voltage provided by the first and second voltage supplies, and providing the highest voltage to a bulk node of a first transistor and a bulk node of the second transistor.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments.

Likewise, the term "embodiments of the invention" does not require that all embodiments of the invention include the discussed feature, advantage or mode of operation. As used herein, when referring to voltage supplies, the term "active" is used to mean when a voltage supply is available for providing a non-zero voltage. Conversely, when a voltage supply is "inactive," it is unavailable and only provides 0 volts. As used herein, the term "reverse bias voltage" is used to generally describe any voltage value across the diode which places a diode in a reversed bias or non-conductive state, which can include a voltage value of zero volts or less.

Figure 1A:
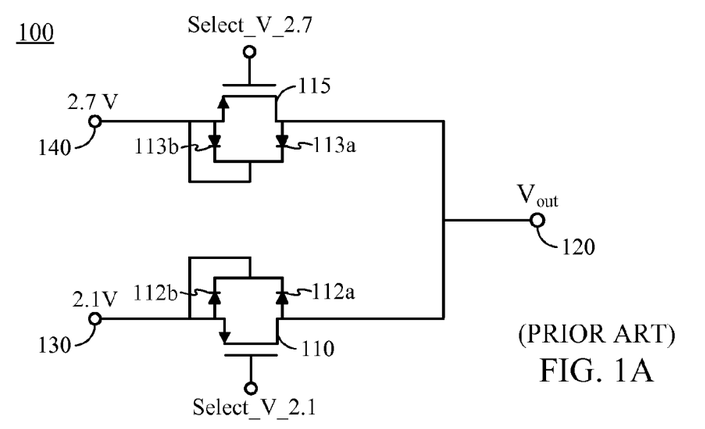
FIGS. 1A-C are schematic diagrams depicting various operational modes of an exemplary selectable voltage supply circuit that does not eliminate parasitic currents.

FIG. 1A is a schematic diagram depicting an exemplary selectable voltage supply (SVS) 100 that does not have circuitry for eliminating parasitic currents, and is presented to illustrate how such currents may arise. The SVS 100 may be fabricated using integrated circuit techniques, and can be used to provide voltages to other portions of a network formed within an integrated circuit.

The SVS 100 may include transistors 110 and 115 and two voltage supplies presented at input nodes 130 and 140. For example, one voltage supply may provide 2.1 volts (V) at input node 130, and the other may provide 2.7 V at input node 140. SVS 100 may use the transistors 110 and 115 as switches to select a supply presented at input node 130 or 140, and provide the selected voltage as $V_{out}$ to output node 120. Each transistor may be switched by providing a corresponding voltage select signal at the transistors' respective control node.

In the exemplary SVS 100 shown in FIG. 1A, the transistors 110, 115 may be p-channel Metallic-Oxide-Semiconductor Field-Effect Transistors (pMOSFETs). The p-channel transistor 110 may have its source and bulk nodes connected to the input node 130, and its drain node connected to the output node 120. The p-channel transistor 110 may be controlled by the voltage select signal "Select_V_2.1," which may be presented to this transistor's gate node. In a similar manner, the p-channel transistor 115 may have its source and bulk nodes connected to the input node 140, and its drain node connected to the output node 120. The p-channel transistor 115 may be controlled by the voltage select signal "Select_V_2.7," which may be presented to this transistor's gate node. Both voltage select signals may be controlled by an internal and/or an external device, for example, a processor (not shown).

In order to select the 2.1 V supply at input node 130, the p-channel transistor 110 may be placed in a conductive state by setting the voltage select signal Select_V_2.1 ON, and setting voltage select signal Select_V_2.7 OFF to place transistor 115 in a non-conductive state. These settings permit the 2.1 volts at input node 130 to propagate through transistor 110 onto output node 120.

Conversely, to select the 2.7 V supply at input node 140, transistor 115 may be placed in a conductive state by setting the voltage select signal Select_V_2.7 ON, and setting voltage select signal Select_V_2.1 OFF to place transistor 110 in a non-conductive state. These settings of the two voltage control signals permit the 2.7 V supply at input node 140 to propagate through transistor 115 onto output node 120.

The voltage levels used to place the voltage select signals in an ON or OFF state depend upon the type of transistors being used to select the voltage supplies. Because p-channel transistors are being used in the example shown in FIG. 1A, the voltage select signals are low (e.g., $V_{GS} \approx 2.7$ volts for device 115; $V_{GS} \approx 2.1$ volts for device 110) when placed in the ON state, and are high (e.g., $V_{GS} \approx 0$) when placed in the OFF state.

Figure 1B:
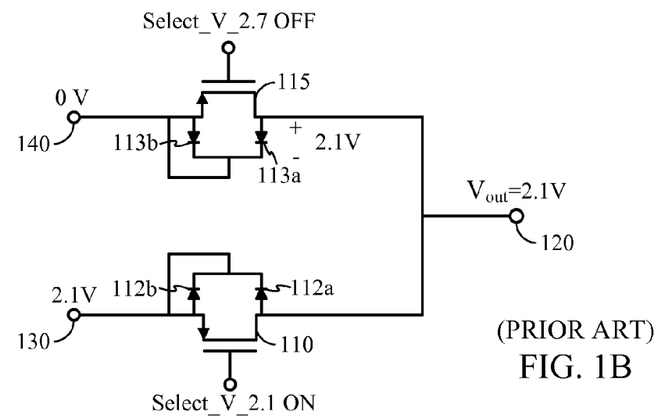
Figure 1C:
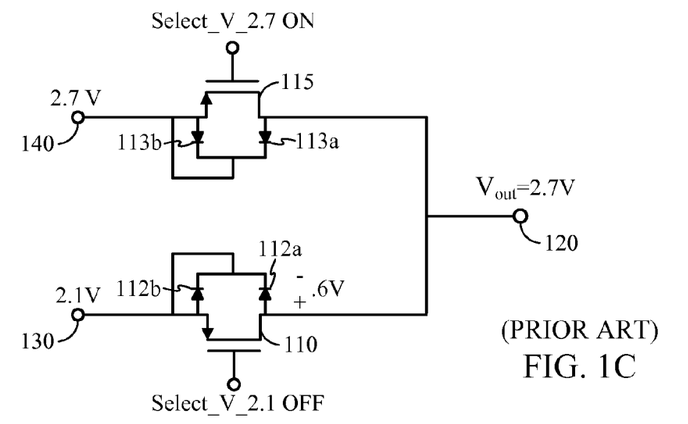

Also shown in FIGS. 1A-C are bulk diodes 112a-b, 113a-b of p-channel transistors 110, 115, respectively. The bulk diodes 112a-b, 113a-b are internal components of the p-channel transistors, and are not to be considered as external, discrete circuit elements. The bulk diodes 112a-b, 113a-b are merely shown to illustrate how circuit paths for parasitic currents can be formed, which will be explained in more detail below.

FIG. 1B shows the SVS 100 in an exemplary transient mode which may occur when the device is turned-on, or if one of the voltage supplies is turned off during normal operation. In the case shown in FIG. 1B, when the voltage supply at node 140 (e.g., 2.7 V voltage supply) is inactive/turned off (i.e., 0 Volts), a parasitic current path may occur when the 2.1 V voltage supply at input node 130 is selected. In this case, p-channel transistor 110 is conducting as Select_V_2.1 is set in an ON state, thus setting $V_{out}$ equal to 2.1 V at output node 120. When the voltage supply at input node 130 is selected, the voltage supply at input node 140 may be inactive and at 0 volts. Also in this selection mode, the p-channel transistor's 115 source-drain path is set in a non-conductive state because Select_V_2.7 is OFF. However, a potential difference of 2.1 volts may be established across the bulk diode 113a within the p-channel transistor 115. This voltage presents a forward bias which is sufficient to turn on the bulk diode 113a, and create a first path for a parasitic current through p-channel transistor 115. This parasitic current can be large (e.g., on the order of hundreds of milliamps), and may trigger latch-up causing irreparable damage to the integrated circuit FIG. 1C shows the SVS 100 during a normal operating mode when both first and second voltage supplies are available. In the case shown in FIG. 1C, a parasitic current path may occur in the SVS 100 when the 2.7 V voltage supply at input node 140 is selected. In this voltage supply selection mode, p-channel transistor 115 is conducting as Select_V_2.7 is ON, thus setting $V_{out}$ equal to 2.7 V at output node 120. In this selection mode, the p-channel transistor's 110 source-drain path is non-conductive because Select_V_2.1 is set in an OFF state. When the voltage supply at input node 140 is selected, the voltage supply at input node 130 remains at 2.1 volts This arrangement can establish a potential difference of 0.6 volts across the bulk diode 112a within in the p-channel transistor 110. Because the turn on voltage for diodes in this example may lie between 0.5-0.7 volts, this voltage may present a forward bias sufficient to turn on the bulk diode 112a, and thus create a second path for a parasitic current through p-channel transistor 110 that may be sufficient to cause malfunctioning of the circuit (e.g., trigger latch-up).

While the exemplary SVS 100 shown in FIGS. 1A-1C show only two voltage supplies, other variations would not preclude using three or more voltage supplies having different voltages. Furthermore, the voltage supply values of 2.1 volts and 2.7 volts are merely exemplary, and other values may be used. Moreover, while p-channel MOSFET technology was shown for transistors 110, 115, other transistor types (such as, for example, n-channel MOSFETs, pFETs, nFETs) may also be used with the appropriate circuit modifications.

Figure 2A:
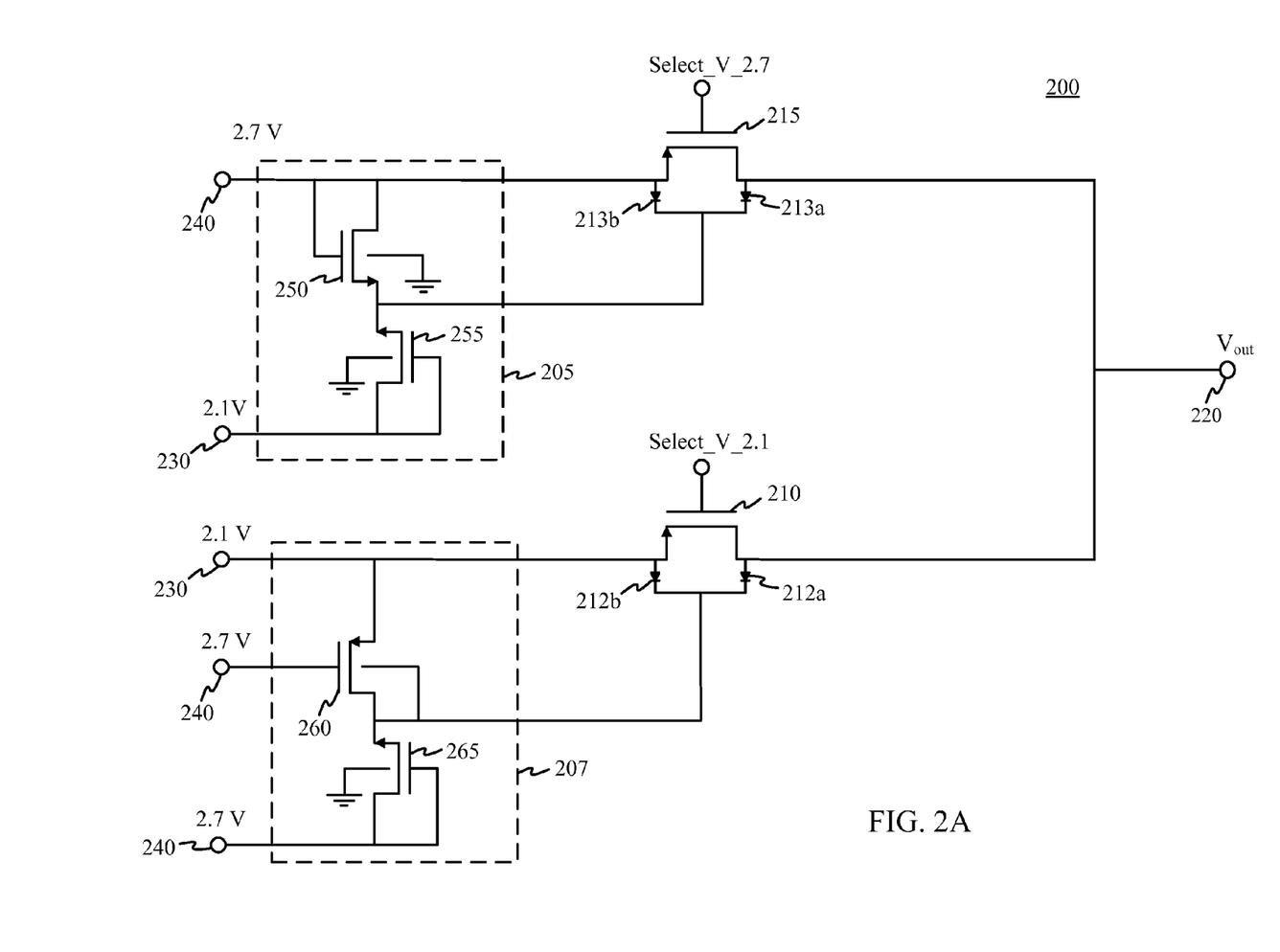
FIGS. 2A-C are schematic diagrams showing various operational modes of an exemplary selectable voltage supply that eliminates parasitic currents.

FIG. 2A is a schematic diagram showing an exemplary SVS 200 which can eliminate or at least mitigate and/or reduce parasitic currents. The SVS 200 may include supply switching transistors 210, 215, and parasitic current inhibitors 205, 207. The parasitic current inhibitor 205 may be coupled to supply switching transistor 215 to prevent parasitic currents flowing through bulk diodes 213a-b. The parasitic current inhibitor 207 may be coupled to supply switching transistor 210 to prevent parasitic currents flowing through bulk diodes 212a-b. The parasitic current inhibitors 205, 207 may automatically prevent current paths from forming within the supply switching transistors 215 and 210, respectively, by providing suitable bias voltages which prevent the bulk diodes 213a-b, 212a-b from becoming forward biased. Details of the various modes of operation of the SVS 200 will be provided below in the descriptions of FIGS. 2B-2C.

As shown in FIG. 2A, the supply switching transistor 210 may be a p-channel MOSFET transistor having a source node connected to an input node 230, a bulk node connected to parasitic current inhibitor 207, and a drain node connected to an output node 220. A voltage supply may be provided at input node 230, which may have a value of 2.1 volts. The supply switching transistor 215 may also be a p-channel MOS transistor, having a source node connected to an input node 240, a bulk node connected to parasitic current inhibitor 205, and a drain node also connected to the output node 220. A voltage supply may be provided at input node 240, which may have a value of 2.7 volts. Voltage select signals may be provided to the gate nodes of supply switching transistors 210, 215 for switching control. The voltage select signal Select_V_2.1 may be provided to the gate node of supply switching transistor 210, and the voltage select signal Select_V_2.7 may be provided to the gate node of supply switching transistor 215.

The basic functionality of the voltage select signals and how they are used to select a voltage supply from input nodes 230 and 240 may be similar to the operation described above for SVS 100 in FIGS. 1A-C, and will not be repeated here.

Further referring to FIG. 2A, the parasitic current inhibitor 205 may include n-channel transistors 250, 255. The n-channel transistor 250 may have both gate and drain nodes connected to input node 240 which may be associated with the 2.7 volt supply, and further connected to the supply node of supply switching transistor 215. The source node of n-channel transistor 250 may be connected to the bulk node of supply switching transistor 215. The bulk node of n-channel transistor 250 may be connected to ground. The n-channel transistor 255 may have its source node connected to the source node of n-channel transistor 250, and to the bulk node of supply switching transistor 215. The bulk node of n-channel transistor 255 may be coupled to ground. The drain and gate nodes of n-channel transistor 255 may be connected to input node 230 which may be associated with the 2.1 volt supply.

The parasitic current inhibitor 207 may include a p-channel transistor 260 and an n-channel transistor 265. The source node of the p-channel transistor 260 may be connected to the input node 230, and the source node of the supply switching transistor 210. The gate node of the p-channel transistor 260 may be connected to the input node 240. The bulk and drain nodes of the p-channel transistor 260 may be connected to the bulk node of supply switching transistor 210. The source node of the n-channel transistor 265 may be connected to the bulk and drain nodes of p-channel transistor 260, and further connected to the bulk node of supply switching transistor 210. The drain and gate nodes of n-channel transistor 265 may be connected to input node 240. The bulk node of n-channel transistor 265 may be connected to ground.

Figure 2B:
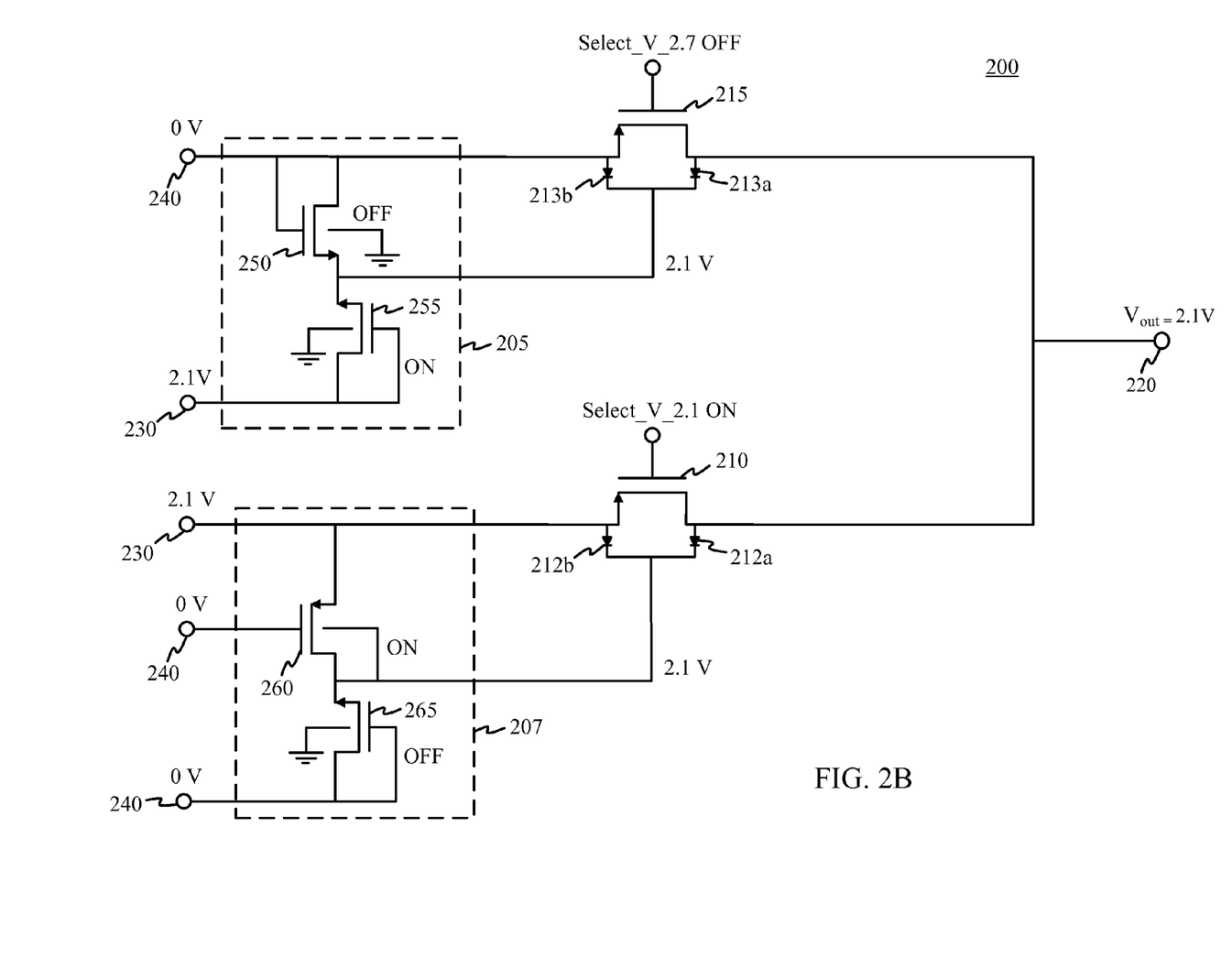

FIG. 2B shows the SVS 200 in an exemplary transient mode which may occur when the device is turned-on, or if one of the voltage supplies is turned off during normal operation. In the case shown in FIG. 2B, when the voltage supply at node 240 (e.g., 2.7 V voltage supply) is turned off (i.e., 0 Volts). Further, FIG. 2B illustrates the operation of SVS 200 when the voltage supply associated at input node 230 (e.g., 2.1 volts) may be provided to the output node 220. In this selection mode, voltage select signal Select_V_2.1 may be set to ON, which can place supply switching transistor 210 in a conducting state, and set the output node ($V_{out}$) at 2.1 volts.

Voltage select signal Select_V_2.7 may be set to OFF, placing the source-drain path of supply switching transistor 215 in a non-conducting state.

During this mode, the parasitic current inhibitor 207 may connect the bulk and source nodes of supply switching transistor 210 to input node 230, which will set the bulk node of supply switching transistor 210 to 2.1 volts. This can allow the supply switching transistor to propagate the 2.1 volts from the supply at input node 230 to the output node 220. Here, p-channel transistor 260 turns ON and n-channel transistor 265 turns OFF automatically when the 2.7V supply is not available (e.g. 0 V).

Further referring to FIG. 2B, the parasitic current inhibitor 205 may apply 2.1 volts to the bulk node of supply switching transformer 215 to prevent the bulk diodes 213a-b from becoming forward biased. This may be accomplished by having n-channel transistor 255 automatically turn on by having its gate voltage set to 2.1 volts. This may establish a connection between the 2.1 volt supply at input node 230 and cathode of bulk diodes 213a-b.

In summary, parasitic current inhibitors 205 and 207 automatically bias the bulk nodes of supply switching transistors 215 and 210, respectively, to the highest voltage supply available. As shown in the case illustrated in FIG. 2B, the bias voltage is 2.1 volts corresponding to the voltage supply associated with input node 230.

Figure 2C:
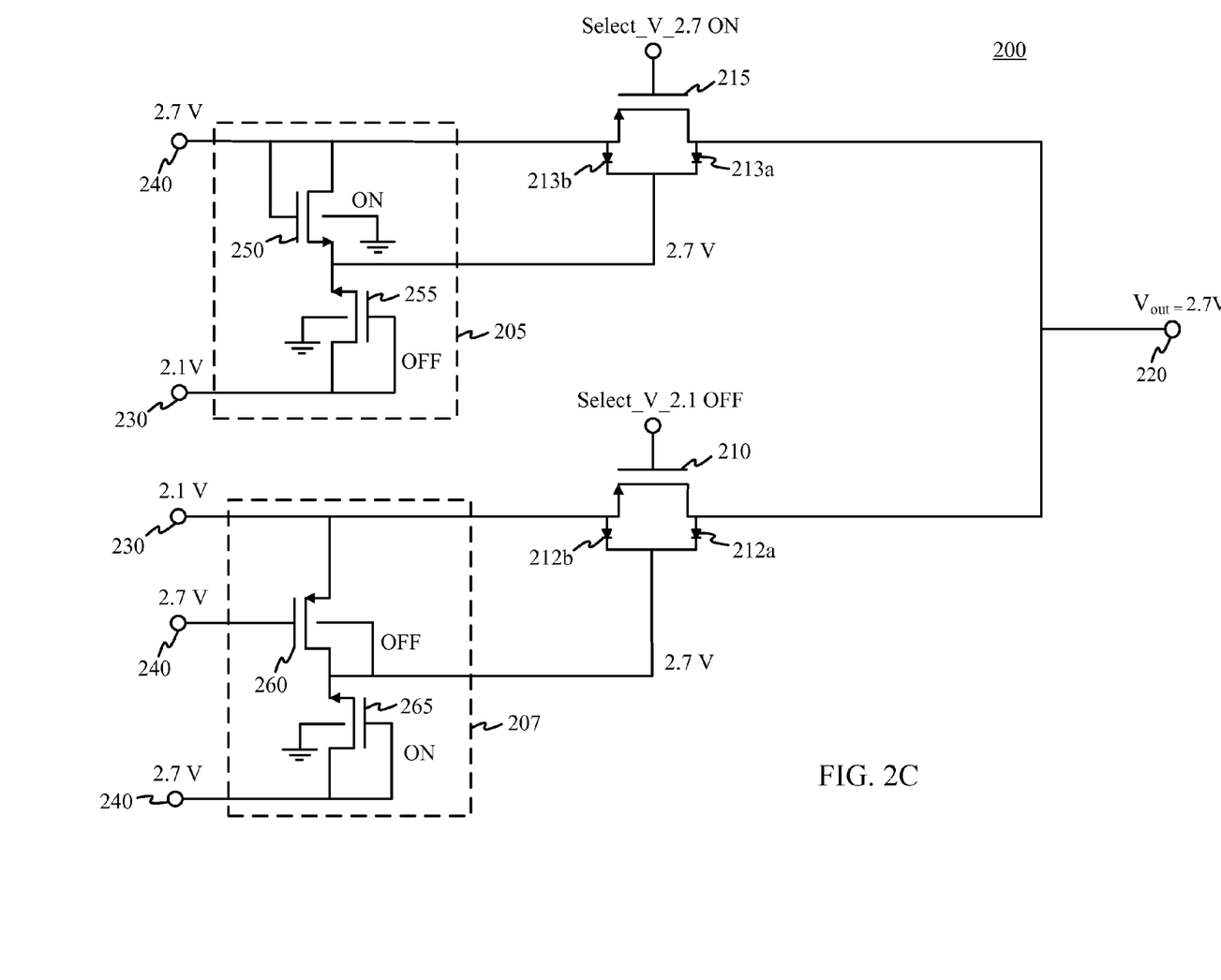

FIG. 2C shows the SVS 200 during a normal operating mode when both first (e.g., 2.7V) and second (e.g., 2.1V) voltage supplies are available. Moreover, FIG. 2C illustrates the operation of the SVS 200 when the voltage supply associated at input node 240 (e.g., 2.7 volts) is provided to the output node 220. In this selection mode, voltage select signal Select_V_2.7 may be set to ON, which can place supply switching transistor 215 in a conducting state, and in turn set the output node ($V_{out}$) at 2.7 volts. Voltage select signal Select_V_2.1 may be set to OFF, placing the source-drain path of supply switching transistor 210 in a non-conducting state.

During this mode, the parasitic current inhibitor 205 may connect the bulk node of supply switching transistor 215 to input node 240, which may set its bulk node to 2.7 volts. The connection of both the bulk node of the supply switching transistor 215 to input node 240 may be accomplished as n-channel transistor 250 turns on automatically. Moreover, in this configuration, n-channel transistor 255 turns off automatically as its drain and source nodes become swapped and the bias between gate and source is now 0 V.

The parasitic current inhibitor 207 may apply 2.7 volts to the bulk node of supply switching transistor 210 to prevent the bulk diodes 212 from becoming forward biased. This may be accomplished by having n-channel transistor 265 turn on by having its gate voltage set to 2.7 volts and transistor 260 OFF. This can establish a connection between the 2.7 volt supply at input node 240 and cathode of bulk diodes 212.

In summary, as shown if FIG. 2C, parasitic current inhibitors 205 and 207 automatically bias the bulk nodes of supply switching transistors 215 and 210, respectively, to the highest voltage supply available. In the case, as illustrated in FIG. 2C, the bias voltage is 2.7 volts which corresponds to the voltage supply associated with input node 240.

While the embodiment of the SVS 200 shown in FIGS. 2A-2C shows only two voltage supplies, various embodiments may not preclude using three or more voltage supplies having different voltages. Furthermore, the voltage supply values of 2.1 volts and 2.7 volts are merely exemplary, and other values may be used in various embodiments. Moreover, while p-channel MOSFET technology was shown for transistors 210, 215, other transistor types (such as, for example, n-channel MOSFETs, pFETs, nFETs may also be used with the appropriate circuit modifications. Additionally, the transistor types shown in the parasitic current inhibitors 205, 207 may also be modified with other known transistor types with the appropriate circuit modifications.

Figure 3:
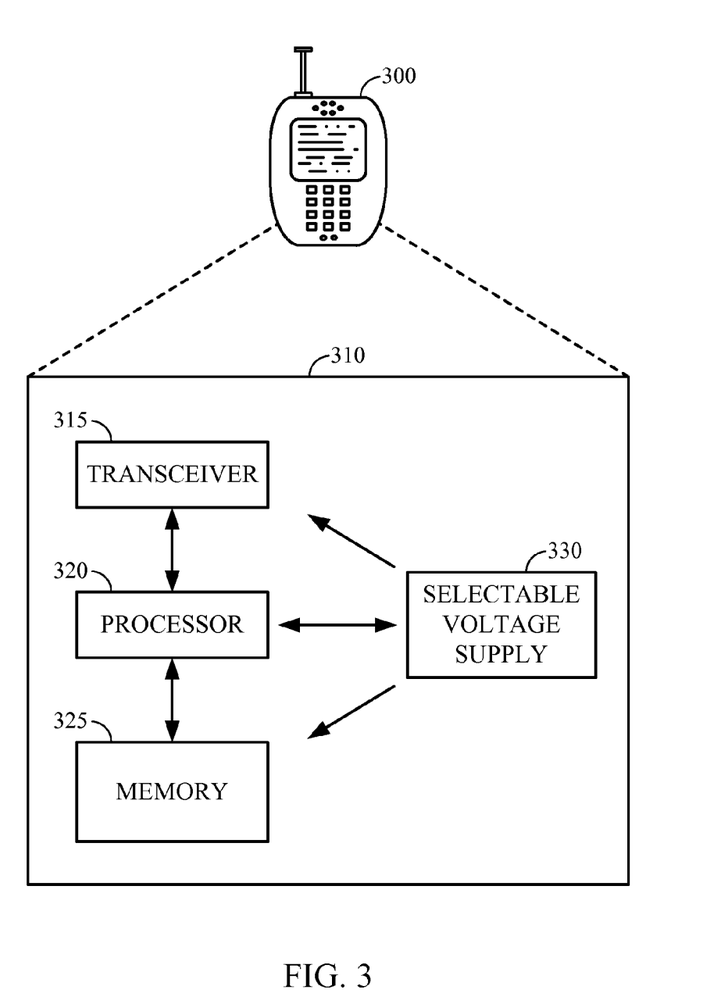
FIG. 3 is a block diagram of an exemplary mobile terminal which utilizes a selectable voltage supply that eliminates parasitic currents.

FIG. 3 is a block diagram of a mobile terminal 300 which may include a selectable voltage supply (SVS) 330. The mobile terminal 300 may have a platform 310 that can exchange data and/or commands over a network. The platform 310 can include a transceiver 315 (which may further include a transmitter and receiver which is not explicitly shown) operably coupled to a processor 320, or other controller, microprocessor, ASIC, logic circuit, or any other data processing device. The processor 320 may execute programs stored in the memory 325 of the mobile terminal 300. The memory 325 can be comprised of read-only and/or random-access memory (RAM and ROM), EEPROM, flash cards, or any memory common to such platforms. The SVS 330 may provide various voltages to one or more components in the mobile terminal platform 310. The SVS 330 may receive commands from processor 320 for setting the voltage select signals in order to supply different voltages to one or more components in platform 310.

The various logic elements for providing commands can be embodied in discrete elements, software modules executed on a processor or any combination of software and hardware to achieve the functionality disclosed herein. For example, the processor 320 and the memory 325 may all be used cooperatively to load, store and execute the various functions disclosed herein and thus the logic to perform these functions may be distributed over various elements. Alternatively, the functionality could be incorporated into one discrete component (e.g., in embedded memory in the processor 320). Therefore, the features of the mobile terminal 300 in FIG. 3 are to be considered merely illustrative and embodiments of the invention is not limited to the illustrated features or arrangement.

Embodiments of the invention may be used in conjunction with any portable device and are not limited to the illustrated embodiments. For example, mobile terminals can include cellular telephones, access terminals, music players, radios, GPS receivers, laptop computers, personal digital assistants, and the like. Further, the selectable voltage supply may be used to provide high and low voltages to various devices such as low noise amplifiers, down converters, voltage control oscillators and the like.

Figure 4A:
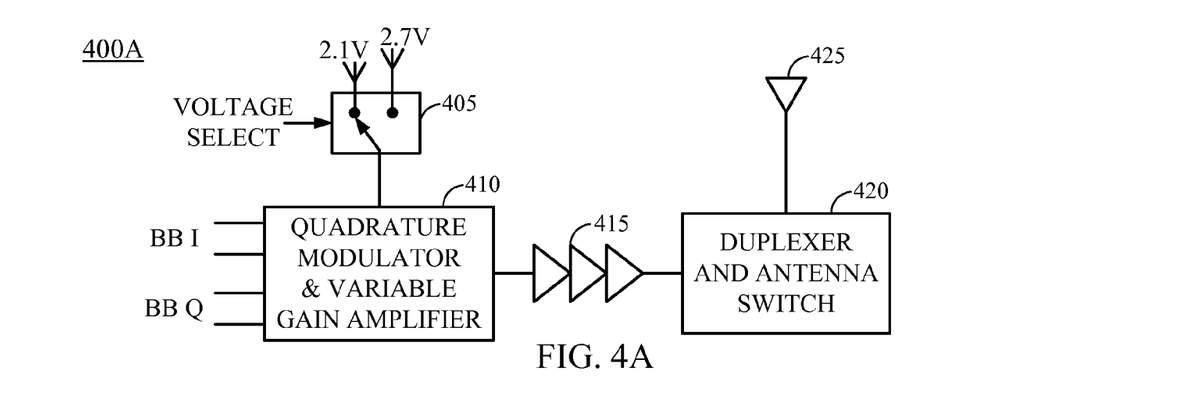
FIGS. 4A-B are block diagrams of exemplary applications of a selectable voltage supply being utilized in an transmitter of a mobile terminal.

FIG. 4A is a block diagram of an exemplary application for a selectable voltage supply in a transmitter 400A of a mobile terminal. Transmitter 400A may include SVS 405, quadrature modulator and variable gain amplifier (QMVGA) 410, power amplifier 415, duplexer and antenna switch 420, and antenna 425. Based on the voltage select signals, SVS 405 may switch between two or more voltage supplies (e.g., 2.1 V and 2.7 V). The selected voltage may be supplied to the QMVGA 410. The QMVGA may perform various real-to-complex conversion and modulation on baseband I and Q signals, and perform subsequent amplification and broadcasting of the signals using power amplifier 415, duplexer and antenna switch 420, and antenna 425.

Figure 4B:
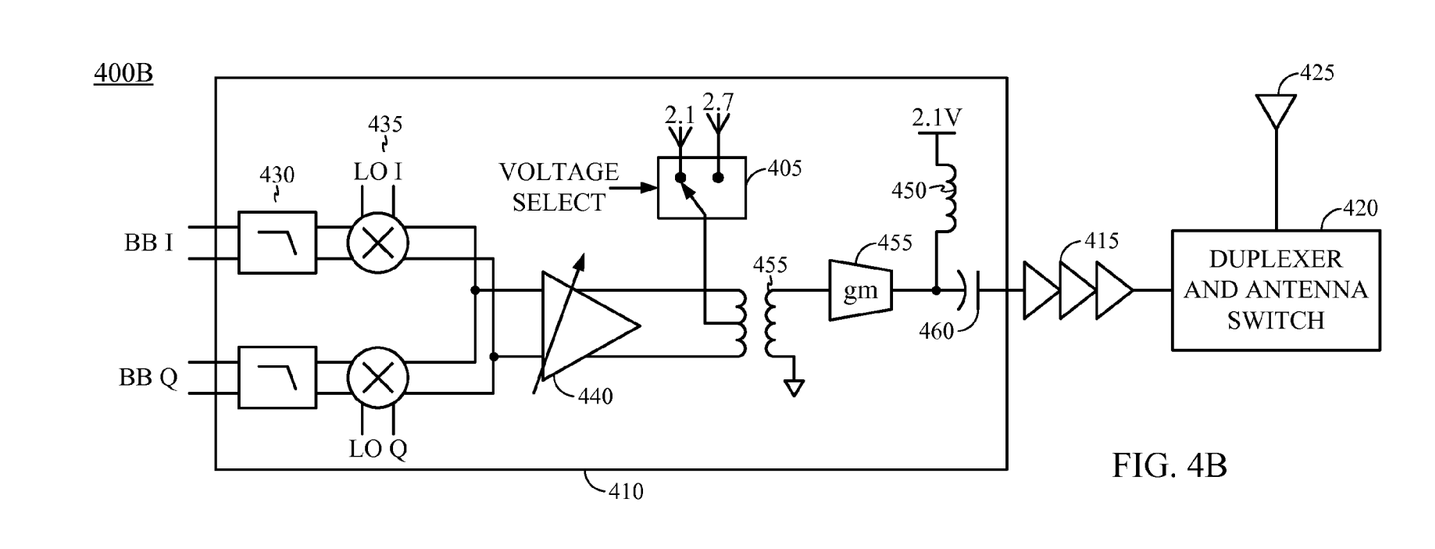

FIG. 4B is a block diagram of an exemplary transmitter 400B which shows additional details of how the SVS 405 is used within the QMVGA 410. The circuit received baseband I (BB I) and Q (BB Q) signals and passes the signals through filters 430 into mixers 435. The baseband signals are mixed with an output of a local RF oscillator (LO), wherein the RF LO signals are modulated by the baseband signals. The modulated signals are provided to variable amplifier 440 which drives transformer 445. Transformer 445 is biased by the SVS 405 to a relative high or low voltage. The higher voltage (e.g., 2.7V) may be useful in providing greater linearity, where the lower voltage (e.g., 2.1V) may be used to save current. The output of transformer 445 is coupled to transconductance amplifier 455, which is coupled to an LC circuit comprising inductor 450 and capacitor 460, which feeds power amplifier 415. Power amplifier 415 is coupled to duplexer and antenna switch 420 and antenna 425 to allow for amplification and broadcasting of the signals.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A circuit which selects a supply voltage from a plurality of voltage supplies, comprising:
   a first transistor configured to select a first voltage supply;
   a second transistor configured to select a second voltage supply;
   a first parasitic current inhibitor coupled to the first transistor, the first voltage supply, and the second voltage supply, wherein the first parasitic current inhibitor automatically utilizes the voltage supply providing the highest voltage for preventing a substrate current from flowing through a bulk node of the first transistor; and
   a second parasitic current inhibitor coupled to the second transistor, the first voltage supply, and the second voltage supply, wherein the second parasitic current inhibitor automatically utilizes the voltage supply providing the highest voltage for preventing a substrate current from flowing through a bulk node of the second transistor.

2. The circuit of claim 1, wherein the first parasitic current inhibitor applies the highest voltage to the bulk node of the first transistor, and the second parasitic current inhibitor applies the highest voltage to the bulk node of the second transistor.

3. The circuit of claim 1, wherein the first parasitic current inhibitor further comprises:
   a third transistor having a drain node and a gate node connected to the first voltage supply, and a source node connected to the bulk node of the first transistor; and
   a fourth transistor having a drain node and gate node connected to the second voltage supply, and a source node connected to the source node of the third transistor.

4. The circuit of claim 2, wherein the third and fourth transistors are n-channel transistors.

5. The circuit of claim 1, wherein the second parasitic current inhibitor further comprises:
   a fifth transistor having a gate node connected to the first voltage supply, a source node connected to the second voltage supply, and a drain and bulk node connected to the bulk node of the second transistor; and a sixth transistor having a drain node and gate node connected to the first voltage supply, a source node connected to the drain node of the fifth transistor.

6. The circuit of claim 5, wherein the fifth transistor is a p-channel transistor and sixth transistor is an n-channel transistor.

7. The circuit of claim 1, wherein
the first transistor is a p-channel transistor having a source node connected to the first voltage supply, the bulk node coupled to the first parasitic current inhibitor, a drain node coupled to an output node, and a gate node which receives a first voltage select signal, and further wherein
the second transistor is a p-channel transistor having a source node connected to the second voltage supply, the bulk node coupled to the second parasitic current inhibitor, a drain node coupled to the output node, and a gate node which receives a second voltage select signal.

8. The circuit of claim 7, wherein
the first transistor completes a current path between the first voltage supply and the output node when the first voltage select signal is an ON state; and
the second transistor completes a current path between the second voltage supply and the output node when the second voltage select signal is set in an ON state.

9. The circuit of claim 1, wherein the circuit provides a supply voltage selected from a plurality of voltage supplies to a one or more components in a mobile terminal.

10. The circuit of 9, wherein the selected supply voltage is provided to a primary side of a transformer within a quadrature modulator and variable gain amplifier unit within the mobile terminal.

11. The circuit of 9, wherein the selected supply voltage is provided to at least one of a low noise amplifier, a down converter, or a voltage control oscillator within the mobile terminal.

12. A circuit for mitigating parasitic currents in a selectable voltage supply, comprising:
a first n-channel transistor having a drain node and a gate node connected to a first voltage supply, wherein the first n-channel transistor couples a bulk node and a source node of a first supply switching transistor when the first voltage supply is active; and
a second n-channel transistor having a drain node and a gate node connected to a second voltage supply, and a source node connected to the source node of the first n-channel transistor, wherein the second n-channel transistor applies a reverse bias voltage to the first supply switching transistor when the first voltage supply is inactive.

13. The circuit of claim 12, further comprising:
a first p-channel transistor having a gate node connected to the first voltage supply, a source node connected to the second voltage supply, wherein the first p-channel transistor couples a bulk node and a source node of a second supply switching transistor when the first voltage supply is inactive; and
a third n-channel transistor having a drain node and gate node connected to the first voltage supply, and a source node connected to the drain node of the first p-channel transistor, wherein the third n-channel transistor applies the reverse bias voltage to the second supply switching transistor when the first voltage supply is active.

14. The circuit of claim 13, wherein the reverse bias voltage is provided automatically by selecting the highest voltage among the first and the second voltage supplies.

15. The circuit of claim 13, wherein
the first supply switching transistor is a p-channel transistor having a source node connected to the first voltage supply, a drain node coupled to an output node, a bulk node connected to a source node of the first n-channel transistor, and a gate node which receives a first voltage select signal, and further wherein
the second supply switching transistor is a p-channel transistor having a source node connected to the second voltage supply, a bulk node connected to a drain and bulk node of the third n-channel transistor, a drain node coupled to the output node, and a gate node which receives a second voltage select signal.

16. The circuit of claim 15, wherein, when the first voltage select signal is an ON state, the first supply switching transistor is conducting and completes a current path between the first voltage supply and the output node.

17. The circuit of claim 15, wherein, when the second voltage select signal is an ON state, the second supply switching transistor is conducting and completes a current path between the second voltage supply and the output node.

18. The circuit of claim 15, wherein the output node is coupled to one or more components in a mobile terminal to provide a selected supply voltage.

19. The circuit of 18, wherein the selected supply voltage is provided to a primary side of a transformer within a quadrature modulator and variable gain amplifier unit within the mobile terminal.

20. The circuit of 18, wherein the selected supply voltage is provided to at least one of a low noise amplifier, a down converter, or a voltage control oscillator within the mobile terminal.

21. A method for mitigating parasitic currents in a circuit having a plurality of voltage supplies, comprising:
receiving a first voltage select signal having an ON and OFF state, wherein the ON state corresponds to a first voltage supply being selected by a first transistor;
receiving a second voltage select signal having an ON and OFF state, wherein the ON state corresponds to a second voltage supply being selected by a second transistor;
determining automatically the highest voltage provided by the first and second voltage supplies;
providing the highest voltage to a bulk node of the first transistor and to a bulk node of the second transistor; and
selecting the highest voltage during a transient mode when one of the voltage sources is at zero volts.

22. The method according to claim 21, further comprising:
providing the second voltage to the bulk node of the first transistor and to the bulk node of the second transistor, when the first voltage is lower than the second voltage; and
automatically switching to provide the first voltage to the bulk node of the first transistor and to the bulk node of the second transistor, when the first voltage is greater than the second voltage.

23. An apparatus for mitigating parasitic currents in a circuit having a plurality of voltage supplies, comprising:
means for receiving a first voltage select signal having an ON and OFF state, wherein the ON state corresponds to a first voltage supply being selected;

means for receiving a second voltage select signal having an ON and OFF state, wherein the ON state corresponds to a second voltage supply being selected;

means for determining automatically the highest voltage provided by the first and second voltage supplies;

means for providing the highest voltage to a bulk node of a first transistor and a bulk node of the second transistor; and selecting the highest voltage during a transient mode when one of the voltage sources is at zero volts.

24. The apparatus according to claim 21, further comprising:

means for providing the second voltage to the bulk node of the first transistor and to the bulk node of the second transistor, when the first voltage is lower than the second voltage; and means for automatically switching to provide the first voltage to the bulk node of the first transistor and to the bulk node of the second transistor, when the first voltage is greater than the second voltage.

* * * * *